(12) United States Patent
Fang et al.

(10) Patent No.: US 7,014,710 B2
(45) Date of Patent: Mar. 21, 2006

(54) METHOD OF GROWING SINGLE CRYSTAL GALLIUM NITRIDE ON SILICON SUBSTRATE

(75) Inventors: Yean Kuen Fang, Tainan (TW); Wen Rong Chang, Yongkang (TW); Shyh Fann Ting, Gangshan (TW); Hon Kuan, Tainan (TW); Cheng Nan Chang, Sinshih (TW)

(73) Assignee: National Cheng-Kung University, Tainan (TW)

( * ) Notice: Subject to any disclaimer, the term of this patent is extended or adjusted under 35 U.S.C. 154(b) by 228 days.

(21) Appl. No.: 10/615,632

(22) Filed: Jul. 8, 2003

(65) Prior Publication Data

US 2004/0074437 A1   Apr. 22, 2004

(30) Foreign Application Priority Data

Oct. 16, 2002   (TW) ................................ 91124151 A

(51) Int. Cl.
  *C30B 25/12* (2006.01)
  *C30B 25/14* (2006.01)
(52) U.S. Cl. .......................... 117/92; 117/93; 117/102; 117/103
(58) Field of Classification Search ................. 117/92, 117/93, 102, 103
See application file for complete search history.

(56) References Cited

U.S. PATENT DOCUMENTS 6,844,227 B1 * 1/2005 Kubo et al. .................. 438/216

* cited by examiner

*Primary Examiner*—Felisa Hiteshew
(74) *Attorney, Agent, or Firm*—Pro-Techtor Int'l Services

(57) ABSTRACT

A method of growing single crystal Gallium Nitride on silicon substrate is disclosed including: removing oxide layer of silicon substrate, growing buffer layer of Silicon Carbon Nitride (SiCN), and growing single crystalline Gallium Nitride thin film, characterized in that a buffer layer of SiCN is grown to avoid lattice mismatch which appears when Gallium Nitride is grown directly on silicon substrate, and that Rapid Thermal Chemical Vapor Deposition is adopted to grow SiCN buffer layer, and that Metalorganic Chemical Vapor Deposition is adopted to grow single crystalline GaN thin film. The method of present invention has advantages: a) eliminating lattice mismatch between GaN and Si effectively, b) taking the place of sapphire substrate which has high lattice mismatch, and SiC substrate which is expensive, c) intergrating with maturely-developed, cheap silicon semiconductor industry, d) being compatible with VLSI technology, e) being fabricated in large area substrate, f) no need of isolated etching, g) smaller dimension of each unit GaN element, h) convenience to fabricate vertical-structured LED or LD element, I) promoting GaN elements quality, j) increasing yield, k) reducing manufacturing cost.

21 Claims, 4 Drawing Sheets

METHOD OF GROWING SINGLE CRYSTAL GALLIUM NITRIDE ON SILICON SUBSTRATE

BACKGROUND OF THE INVENTION

1. Field of the Invention

The present invention relates to a method of growing single crystal Gallium Nitride (GaN), particularly to a method of growing single crystal Gallium Nitride (GaN) on silicon substrate.

2. Description of Related Art

Due to rapid advance of researching and fabrication of ultraviolet to blue optoelectronic elements, such as blue light emitting diode, blue LASER semiconductor, ultraviolet sensor, GaN has been one of the most important wide-band-gap semiconductor materials in group III nitride. At the present, GaN grows on sapphire or silicon carbide substrates, however those two substrates are expensive, and it is not easy to integrate with silicon s miconductor which is mature and cheap, and consequently the market growth of those two technology is retarded. Owing to wide application range, mature and cheap silicon technology, advantage and potential of growing GaN elements on silicon wafer is expected. It is best to grow GaN film on GaN substrate, but it is regrettable that GaN substrate of large area (over two inch in diameter) and low defects is still under research, therefore to find another substrate materials is necessary. Substrate used most frequently for the time being is sapphire. Owing to 16% lattice mismatch between sapphire and GaN, it is difficult to achieve high quality GaN buffer layer. Silicon carbide is another potential substrate material, because of its only 3% lattice mismatch between SiC and GaN, good electric and thermal conductivity, but it is very expensive, and not suitable to commercialize. As a result, to find a technology is valuable of growing substrate which has low lattice mismatch with GaN, good electric and thermal conductivity, low price. Owing to wide application range, mature and cheap silicon technology, growing GaN elements on silicon wafer has its advantage and potential. However, grow directly GaN on silicon wafer will results in high density of defects and cracks, and consequently the hetero-structure eptiaxy technology is retarded.

SUMMARY OF THE INVENTION

An object of the present invention is to provide a method of growing Silicon Carbon Nitride(SiCN) film as buffer layer to help grow GaN elements, and to break trough bottleneck of hetero-structure eptiaxy technology. Another object of the present invention is to utilize SiCN buffer layer which eliminates lattice mismatch between GaN and silicon wafer to substitute sapphire and SiC substrates for security of GaN elements quality and obvious discount of manufacturing cost.

To achieve objects mentioned above, the present invention provides a method of growing Gallium Nitride on silicon wafer, including: (a) providing silicon wafer as substrate on which GaN film grows, (b) remove the oxide layer on the surface of silicon substrate, (c) growing a buffer layer of SiCN upon silicon substrate by the way of providing a gas mixture of $H_2$, $SiH_4$, $NH_3$, and $C_3H_8$, under a specified temperature, pressure, during a specified length of time, (d) growing GaN film upon the buffer layer of SiCN by the way of providing source materials into reactor under a specified temperature, pressure, with a specified rotating speed of substrate, wherein silicon substrate could be p-type or n-type, and oriented in <100> or <111> directions. Chemical Vapor Deposition (CVD) or Rapid Thermal Chemical Vapor Deposition (RTCVD) can be applied to process (b) and (c) to remove the oxide layer on the surface of silicon substrate and grow SiCN buffer layer. In the SiCN growing process (c), pressure ranges from 0.1 mTorr to 40 Torr, and temperature ranges from 750° C. to 1500° C. In the GaN growing process (d), pressure ranges from 50 Torr to 700 Torr, and temperature ranges from 400° C. to 1200° C., and rotating speed of substrate ranges from 10 rpm to 1000 rpm.

Moreover, in the GaN growing process (d), Metalorganic Chemical Vapor Deposition can be applied to grow a GaN buffer layer to thickness of 100 Å to 700 Å at lower temperature, and then to grow a formal GaN film to thickness of 0.5 μm to 5 μm at higher temperature, and finally a structure of multiple layers of GaN/SiCN/Si substrate forms.

LIST OF REFERENCE NUMERALS

10 silicon substrate
20 SiCN buffer layer
30 Gallium Nitride

DETAILED DESCRIPTION OF THE PRESENT INVENTION

Figure 1:
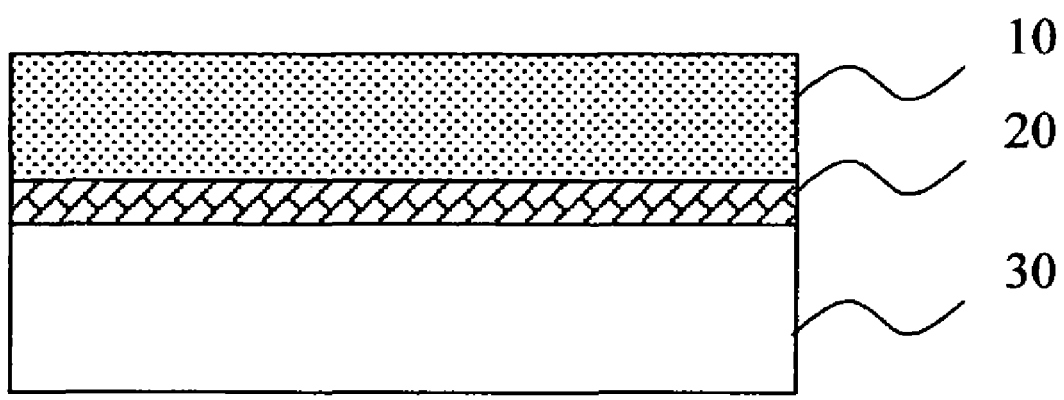
FIG. 1 illustrates the structure of the multiple layers of the present invention

FIG. 1 illustrates the multiple layers structure of the present invention, with the SiCN buffer layer 20 grown on silicon substrate 10, and then single crystal GaN 30 grown on SiCN buffer layer 20.

The steps of method of growing single crystal Gallium Nitride on silicon substrate of the present invention are described as follows:

Step1: providing silicon substrate 10 oriented in <100> or <111> direction, which is p-type or n-type, besides, specific resistivity of which could be any value, as specific resistivity of silicon substrate 10 does not affect the process.

Step2: removing oxide layer of silicon substrate 10, by using Rapid Thermal Chemical Vapor Deposition (RTCVD) or Chemical Vapor Deposition (CVD).

Step3 growing a SiCN buffer layer 20 on silicon substrate 10, to thickness of 2000 Å to 10000 Å, which eliminates lattice mismatch between GaN and silicon substrate effectively, by supplying a gas mixture of $H_2$, $SiH_4$, $NH_3$, and $C_3H_8$, to reactor maintaining at a specified growing pressure and temperature, during a specified length of growing time.

In step3, each flow rate of $H_2$, $SiH_4$, $NH_3$, and $C_3H_8$ depends on dimension of reactor and gas pipe design; $C_3H_8$ can be substituted by $CH_4$, $C_2H_4$, $SiCH_6$, $NH_3$ can be substituted by $N_2$; growing pressure ranges from 0.1 m Torr to 40 Torr, and growing temperature ranges from 750° C. to 1500° C. The chemical composition of grown SiCN buffer layer ranges as: Si (1−x−y): 35–65 at. %, C (x) 0.1–25 at. %, N (y) 30–60 at. %, and the thickness of SiCN buffrer layer increases with time. The step3 adopts Rapid Thermal Chemical Vapor Deposition (RTCVD) or Chemical Vapor Deposition (CVD) to grow SiCN buffer layer; the ability of high speed temperature shifting in RTCVD makes growing of SiCN constricted to the specified high temperature and promotes the quality SiCN film; besides, low-temperatured replacing of reacting gas of RTCVD system makes retention time of residual reacting gas decrease. In contrast with conventional CVD, adopting RTCVD to grow SiCN has the following advatanges: (1) it is easier to grow crystal on interface between abruptly changing structures. (2) it is easier to grow very thin film. (3) it is easier to grow multiple layer structure. (4) rapid temperature rising reduces pollution. (5) it has quick annealing function also.

Step4: growing GaN thin film 30 on SiCN buffer layer 20, by supplying $N_2$, $H_2$, $SiH_4$, $NH_3$, TMGa(TrimethylGallium), TEGa(TriethylGallium), TMAl(TrimethylAlluminium), TMln(Trimethy llndium), and $CP_2Mg$(Cyclo-Pentadienyl Magnesium) to reactor maintaining at specified growing temperature ranging from 400° C. to 1200° C., specified growing pressure ranging from 50 Torr to 700 Torr, and specified rotating speed of substrate ranging from 10 rpm to 1000 rpm.

In step 4, Metalorganic Chemical Vapor Deposition (MOCVD) can be adopted to grow a GaN buffer layer about 100 Å to 700 Å in thickness, at specified growing pressure ranging from 200 Torr to 700 Torr, and at lower specified growing temperature ranging from 400° C. to 800° C. firstly, and then to grow a formal GaN thin film about 0.3 μm to 5.5 μm, at specified growing pressure ranging from 200 Torr to 700 Torr, and at higher specified growing temperature ranging from 900° C. to 1200° C., and consequently a structure of multiple layers of GaN/SiCN/Si substrate forms, as illustrated in FIG. 1.

PREFERRED EMBODIMENT

By referring to the following description and accompanying drawings, preferred embodiment will be demonstrated clearly.

The preferred embodiment of the present invention adopts n-type silicon crystal chip oriented in <100> direction as substrate 10, 400±25 μm in thickness, with specific resistivity ranging from 4 ohm-cm to 10 ohm-cm. The said embodiment adopts RTCVD system to remove oxide layer on silicon substrate 10 and to grow a SiCN buffer layer 20, about 4750 Å in thickness, which eliminates lattice mismatch between silicon substrate 10 and GaN 30, and then adopts MOCVD system to grow a single crystal GaN thin film 30 on SiCN buffer layer 20, wherein a GaN buffer layer about 200 Å to 300 Å in thickness is grown at lower growing temperature ranging from 500° C. to 600° C., and then the formal single crystal GaN thin film about 1.2 μm in thickness grown at higher growing temperature ranging from 1000° C. to 1100 C. GaN thin film thus fabricated is the achievement of the present invention.

Figure 2:
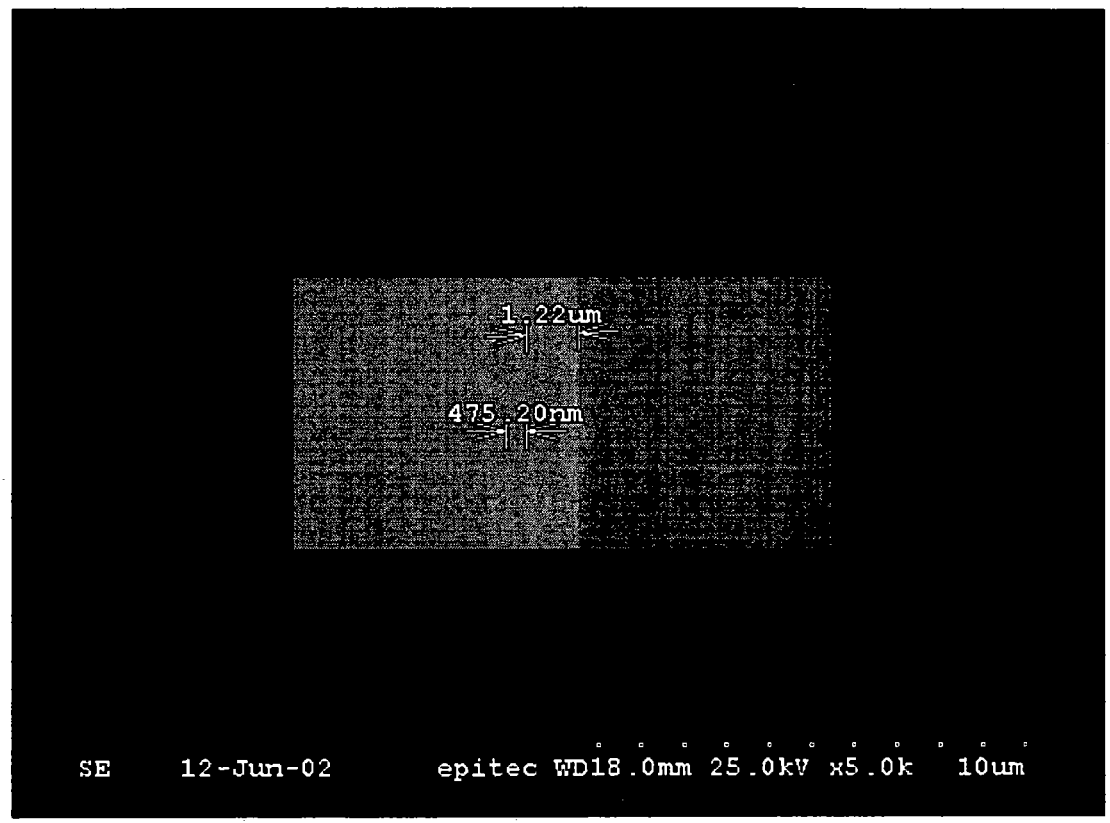
FIG. 2 illustrates the scanning electronic microscope photograph of multiple layers of the present invention
Figure 3:
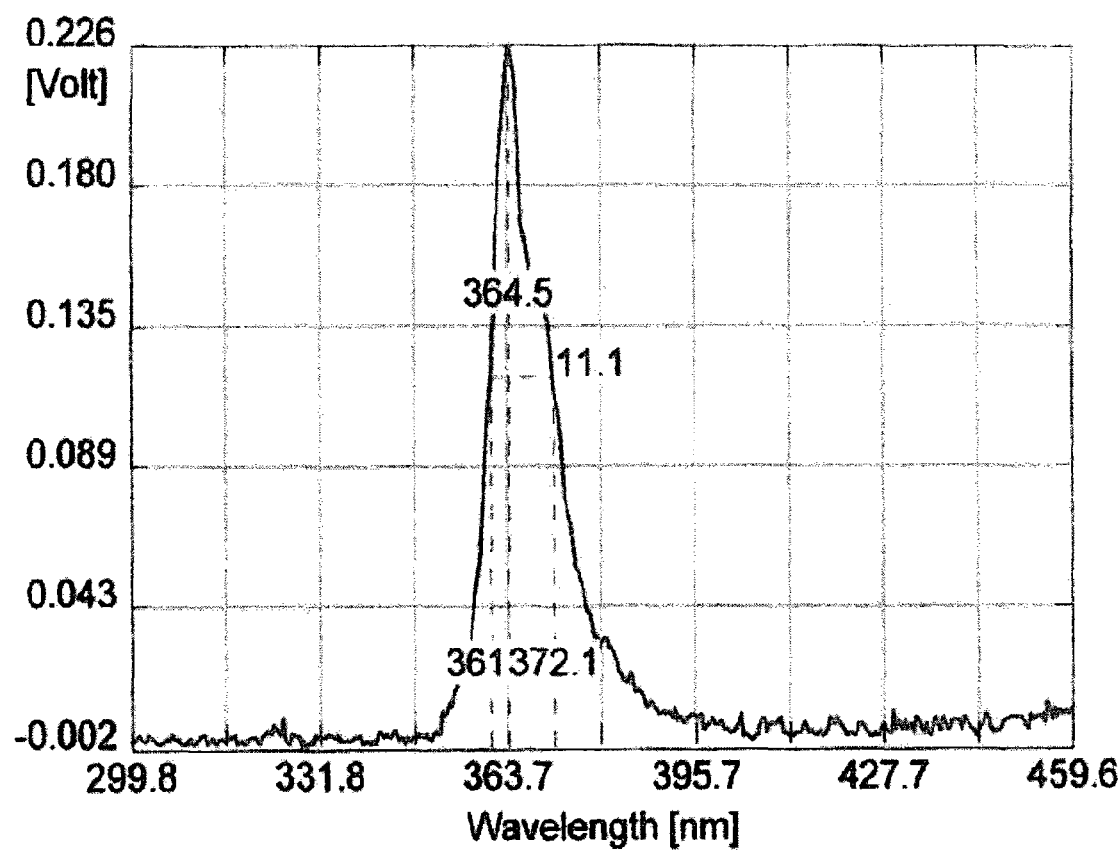
FIG. 3 illustrates the photoluminescence spectra emitting from the multiple layers of the present invention

By scanning electronic microscope, two layers of epitaxial crystal can be observed clearly, SiCN layer 4750 Å thick, and GaN layer 1.2 μm thick, as illustrated in FIG. 2.

By the photoluminescence spectra, there is a peak observed at about 364 nm, corresponding to energy gap 3.4 eV of GaN.

By the Hall measurement system, the GaN thin film has electron transition rate 320 $cm^2$/V-s, and electron density $1 \times 10^{18} cm^{-3}$, correspondent to characteristics of GaN thin film grown on sapphire substrate.

Figure 4:
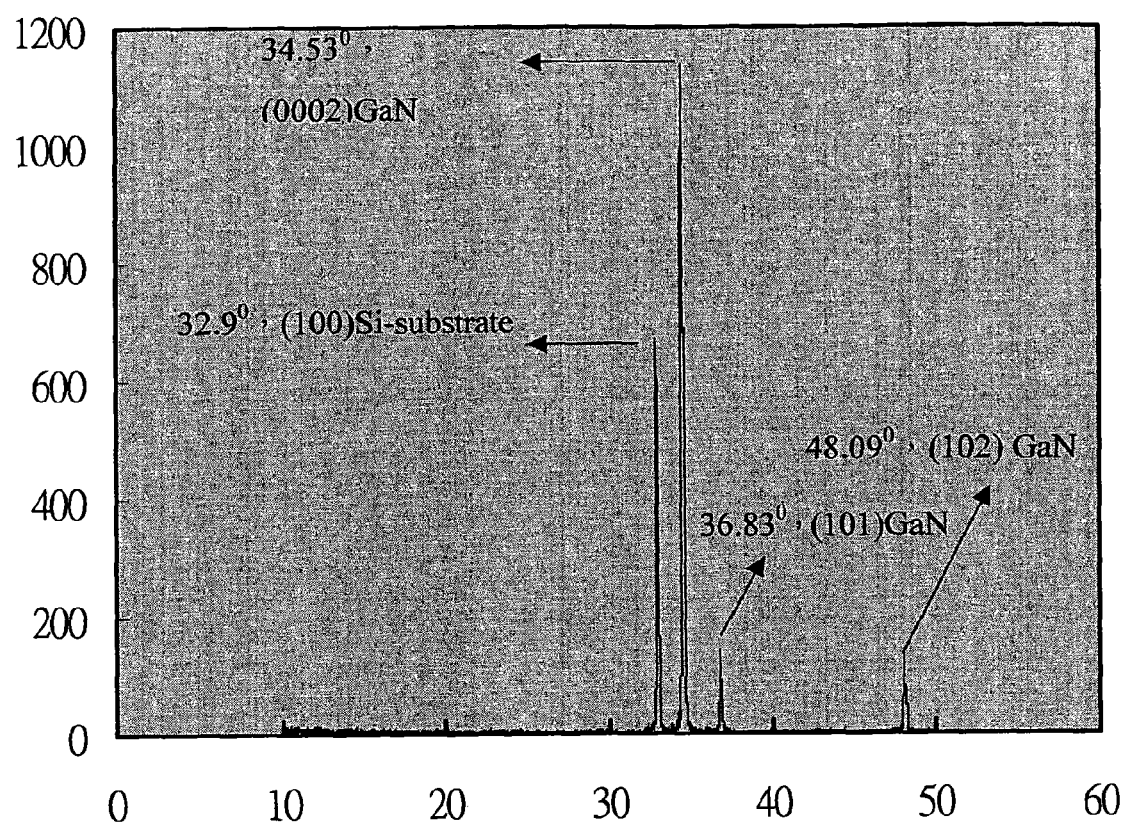
FIG. 4 illustrates double crystal x-ray diffraction analysis (DCXRD) record of multiple layers of the present invention

BY X-ray diffraction analysis, there are four peaks, as illustrated in FIG. 4, including:
1. peak at 32.9°, relating to (100) of silicon substrate.
2. peak at 34.53°, relating to (0002) of GaN.
3. peak at 36.83°, relating to (101) of GaN.
4. peak at 48.09°, relating to (102) of GaN.

From the figure, it is concluded that the lattice constant of SiCN buffer layer match that of Si substrate completely. In contrast with defects of growing GaN thin film on sapphire, the present invention's method of growing single crystalline GaN thin film on SiCN buffer layer grown on Si substrate has the following advantages:

1. The present invention eliminates lattice mismatch between GaN and Si so effectively that GaN elements quality is promoted obviously with reducing of manufacturing cost greatly, and then sapphire or SiC substrates can be taken place.
2. As the present invention can integrate with maturely-developed, cheap silicon semiconductor industry, growing GaN element on silicon wafer has advantages of capability of being manufactured in large area, compatibility with very-large-scale-integration technology, in contrast with expensive cost and incompatibility with silicon semiconductor industry, of the conventionally adopted sapphire or SiC substrates.
3. As the present invention adopts silicon substrate which can be made electrically conductive, it is convenient to manufacture vertical-structured LED or LD elements, in contrast with inconvenience of growing a low density GaN buffer layer to favor the growth of Nitride elements and arranging all n-type and p-type Ohmic-contact metals on the same side of chip as a result of insulating property of conventionally adopted sapphire.
4. As silicon crystal has natural cleavage plane, it is unnecessary to do isolated etching, and the chip size of each element needs only 0.1", in contrast with 0.15" of sapphire substrate, and consequently the process of the present invention is simpler with benefit of reduction of cost and increase of yield.

While the present invention has been described with reference to the preferred embodiment, it is to be understood that modifications and variations may be easily made without departing from the spirit of this invention which is defined by the appended claims.

What is claimed is:

1. A method of growing a Gallium Nitride on a silicon substrate, including the following steps:
    (a) providing a silicon substrate,
    (b) removing the oxide layer on said silicon substrate,
    (c) growing a buffer layer of a Silicon Carbon Nitride by supplying a gas mixture of $H_2$, $SiH_4$, $NH_3$, and $C_3H_8$ to a reactor maintaining at a specified growing pressure and temperature, during a specified length of growing time,
    (d) growing a Gallium Nitride film upon the said buffer layer of said Silicon Carbon Nitride by providing source materials into a reactor maintaining at a specified temperature and pressure, with a specified rotating speed of said substrate.

2. The method of growing a Gallium Nitride on a silicon substrate according to claim 1, wherein the said silicon substrate is oriented in <100> or <111> direction.

3. The method of growing a Gallium Nitride on a silicon substrate according to claim 1, wherein said silicon substrate is of either p-type or n-type, with a specific resistivity of any value.

4. The method of growing a Gallium Nitride on a silicon substrate according to claim 1, wherein, in said step (b), said oxide layer on said silicon substrate is removed by a Rapid Thermal Chemical Vapor Deposition system.

5. The method of growing a Gallium Nitride on a silicon substrate according to claim 1, wherein, in said step (b), said oxide layer on said silicon substrate is removed by a Chemical Vapor Deposition system.

6. The method of growing a Gallium Nitride on a silicon substrate according to claim 1, wherein said $C_3H_8$ gas is substituted by $CH_4$, $C_2H_4$, or $SiCH_6$ gas.

7. The method of growing a Gallium Nitride on a silicon substrate according to claim 1, wherein said $NH_3$ gas is substituted by $N_2$.

8. The method of growing a Gallium Nitride on a silicon substrate according to claim 1, wherein the flow rate of said $H_2$, $SiH_4$, $NH_3$, or $C_3H_8$ gas depends on size of said reactor and gas pipe design of said gases.

9. The method of growing a Gallium Nitride on a silicon substrate according to claim 1, wherein, in said step(c), said growing pressure ranges from 0.1 mTorr to 40 Torr.

10. The method of growing a Gallium Nitride on a silicon substrate according to claim 1, wherein, in said step (c), said growing temperature ranges from 750° C., to 1500° C.

11. The method of growing a Gallium Nitride on a silicon substrate according to claim 1, wherein the chemical composition of said buffer layer of said Silicon Carbon Nitride ranges as: Si (1−x−y): 35–65 at. %, C (x) 0.1–25 at. % , N (y) 30–60 at. %.

12. The method of growing a Gallium Nitride on a silicon substrate according to claim 1, wherein, in said step (c), the thickness of said buffer layer of said Silicon Carbon Nitride increases with said growing time.

13. The method of growing a Gallium Nitride on a silicon substrate according to claim 1, wherein, in said step (c), said buffer layer of said Silicon Carbon Nitride is grown by a Rapid Thermal Chemical Vapor Deposition system.

14. The method of growing a Gallium Nitride on a silicon substrate according to claim 1, wherein, in said step(c), said buffer layer of said Silicon Carbon Nitride is grown by a Chemical Vapor Deposition system.

15. The method of growing a Gallium Nitride on a silicon substrate according to claim 1, wherein, in said step (d), said specified temperature ranges from 400° C. to 1200° C.

16. The method of growing a Gallium Nitride on a silicon substrate according to claim 1, wherein, in said step (d), said specified pressure ranges from 50 Torr to 700 Torr.

17. The method of growing a Gallium Nitride on a silicon substrate according to claim 1, wherein, in said step (d), said specified rotating speed of said substrate ranges from 10 rpm to 1000 rpm.

18. The method of growing a Gallium Nitride on a silicon substrate according to claim 1, wherein, in said step (d), a Metalorganic Chemical Vapor Deposition is used to grow a Gallium Nitride buffer layer in thickness of 100 Å to 700 Å at a lower temperature, and then to grow said Gallium Nitride film in thickness of 0.3 $\mu$m to 5.5 $\mu$m at a higher temperature.

19. The method of growing a Gallium Nitride on a silicon substrate according to claim 18, wherein, said lower temperature ranges from 400° C. to 800° C., and said higher temperature ranges from 900° C. to 1200° C., and both said Gallium Nitride buffer layer and said Gallium Nitride film are grown at a pressure ranging from 50 Torr to 700 Torr.

20. The method of growing a Gallium Nitride on a silicon substrate according to claim 1, wherein said source materials include: $N_2$, $H_2$, $SiH_4$, $NH_3$, TMGa (TrimethylGallium), TEGa (TriethylGallium), TMAl (TrimethylAlluminium), TMIn(TrimethylIndium), and $CP_2Mg$ (CycloPentadienyl Magnesium).

21. The method of growing a Gallium Nitride on a silicon substrate according to claim 1, whereby a multiple-layered structure of Gallium Nitride/Silicon Carbon Nitride/Silicon substrate is fabricated.

* * * * *